United States Patent
Liu et al.

(10) Patent No.: US 11,935,579 B2
(45) Date of Patent: Mar. 19, 2024

(54) PROTECTION CIRCUIT AND MEMORY

(71) Applicant: CHANGXIN MEMORY TECHNOLOGIES, INC., Hefei (CN)

(72) Inventors: Geyan Liu, Hefei (CN); Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 274 days.

(21) Appl. No.: 17/451,818

(22) Filed: Oct. 21, 2021

(65) Prior Publication Data

US 2022/0230673 A1 Jul. 21, 2022

Related U.S. Application Data

(63) Continuation of application No. PCT/CN2021/105066, filed on Jul. 7, 2021.

(30) Foreign Application Priority Data

Jan. 19, 2021 (CN) .......................... 202110069469.0

(51) Int. Cl.
| | |
|---|---|
| *G11C 7/00* | (2006.01) |
| *G11C 11/4078* | (2006.01) |
| *G11C 29/08* | (2006.01) |
| *H01L 27/02* | (2006.01) |

(52) U.S. Cl.
CPC .......... *G11C 11/4078* (2013.01); *G11C 29/08* (2013.01); *H01L 27/0251* (2013.01)

(58) Field of Classification Search
CPC ....... G11C 29/50; G11C 11/401; G11C 28/02; G11C 28/34; H05K 999/99

USPC .......................................................... 365/201
See application file for complete search history.

(56) References Cited

U.S. PATENT DOCUMENTS

| | | | |
|---|---|---|---|
| 5,471,429 A * | 11/1995 | Lee ........................ | G11C 29/34 365/201 |
| 7,268,570 B1 | 9/2007 | Audet | |
| 7,937,631 B2 * | 5/2011 | Vogelsang ......... | G11C 29/4401 714/733 |
| 7,944,242 B2 | 5/2011 | Wada | |
| 8,737,150 B2 * | 5/2014 | Mochida ................ | G11C 29/06 365/207 |

(Continued)

FOREIGN PATENT DOCUMENTS

| | | |
|---|---|---|
| CN | 101097243 A | 1/2008 |
| CN | 102495352 A | 6/2012 |

(Continued)

OTHER PUBLICATIONS

First Office Action of the Chinese application No. 202110069469.0, dated Feb. 28, 2022.

*Primary Examiner* — Son T Dinh
(74) *Attorney, Agent, or Firm* — Syncoda LLC; Feng Ma

(57) ABSTRACT

A protection circuit can be applied in a chip, and include: a first protection unit and a first element to be protected, wherein the first protection unit is configured to receive a first input signal and a control signal, and is configured to output a first output signal, the first element to be protected includes a first P-type transistor, and a gate of the P-type transistor is configured to receive the first output signal. When the chip enters a burn-in test, the first output signal is a high-level signal.

19 Claims, 12 Drawing Sheets

(56) References Cited

U.S. PATENT DOCUMENTS

| | | | |
|---|---|---|---|
| 2008/0186785 A1* | 8/2008 | Jun | G11C 29/50 |
| | | | 365/201 |
| 2010/0321065 A1 | 12/2010 | Wada | |
| 2014/0103344 A1 | 4/2014 | Tehranipoor | |
| 2015/0277393 A1 | 10/2015 | Liu et al. | |
| 2019/0044513 A1 | 2/2019 | Ng | |
| 2019/0326893 A1 | 10/2019 | Cho et al. | |

FOREIGN PATENT DOCUMENTS

| CN | 106133536 A | 11/2016 |
|---|---|---|
| CN | 107527647 A | 12/2017 |
| CN | 208063178 U | 11/2018 |
| CN | 109975679 A | 7/2019 |
| CN | 107039299 B | 10/2019 |
| CN | 110459153 A | 11/2019 |
| CN | 112885387 A | 6/2021 |

\* cited by examiner

PROTECTION CIRCUIT AND MEMORY

CROSS-REFERENCE TO RELATED APPLICATIONS

This application is a continuation of International Application No. PCT/CN2021/105066 filed on Jul. 7, 2021, which claims priority to Chinese Patent Application No. 202110069469.0 filed on Jan. 19, 2021. The disclosures of these applications are hereby incorporated by reference in their entirety.

BACKGROUND

Negative Bias Temperature Instability (NBTI) effect refers to the degradation of a series of electrical parameters caused by applying a negative voltage to the gate of a PMOS device at a high temperature.

SUMMARY

The disclosure relates to but not limited to a protection circuit and a memory.

An embodiment of the disclosure provides a protection circuit, including: a first protection unit, wherein the first protection unit is configured to receive a first input signal and a control signal, and is configured to output a first output signal; and a first element to be protected including a first P-type transistor, wherein a gate of the first P-type transistor is configured to receive the first output signal; wherein when the chip enters a burn-in test, the first output signal is a high-level signal.

An embodiment of the disclosure provides a memory including a command decoding module and a protection circuit, wherein the protection circuit includes: a first protection unit, wherein the first protection unit is configured to receive a first input signal and a control signal, and is configured to output a first output signal; a first element to be protected including a first P-type transistor, wherein a gate of the first P-type transistor is configured to receive the first output signal; when the chip enters a burn-in test, the first output signal is a high-level signal, and the command decoding module is configured to output the control signal.

BRIEF DESCRIPTION OF THE DRAWINGS

To describe the technical solutions in the disclosure or the prior art more clearly, the accompanying drawings required for describing the embodiments or the prior art are briefly introduced below. Apparently, the accompanying drawings in the following description show some embodiments of the disclosure, and those skilled in the art can still derive other accompanying drawings from these accompanying drawings without involving an inventive effort.

DETAILED DESCRIPTION

To make the purpose, the technical solutions and the advantages of the disclosure clearer, the technical solutions in the disclosure will be described clearly and integrally in combination with the accompanying drawings in the disclosure. Apparently, the described embodiments are some of the embodiments of the disclosure, but not all of the embodiments. Based on the embodiments in the disclosure, all other embodiments obtained by those skilled in the art without involving an inventive effort shall fall within the scope of protection of the disclosure.

Generally, a chip (also called an integrated circuit) needs to undergo a burn-in test before it leaves the factory. The chip includes a PMOS device. The burn-in test will be carried out at a high bias voltage and a high temperature. NBTI effect will be more significant as the bias voltage on the gate of the PMOS device increases and the temperature rises (for a PMOS device, the lower the bias voltage on the gate and the higher the temperature, the more significant the NBTI effect will be). Therefore, during the test, the PMOS device in the chip will be damaged due to NBTI effect, causing damage to the chip.

At present, when performing a burn-in test on a chip, since the chip includes a PMOS device, NBTI effect can cause damage to the PMOS device in the chip during the test, therefore causing damage to the chip. To solve this problem, the disclosure provides a protection circuit. A first protection unit and a first element to be protected are provided. The first protection unit is configured to receive a first input signal and a control signal, and is configured to output a first output signal. When a chip enters a burn-in test, the first output signal is a high-level signal. The first element to be protected includes a first P-type transistor, and a gate of the first P-type transistor is configured to receive the first output signal. Because the first output signal received by the gate of the first P-type transistor is a high-level signal when the chip enters the burn-in test, and NBTI effect will occur when an input signal to the gate of the P-type transistor is a low-level signal. When the input signal (i.e., the first output signal) to the gate of the first P-type transistor is a high-level signal when the chip enters the burn-in test, NBTI effect of the first P-type transistor can be avoided, thereby avoiding damage caused by the NBTI effect to the first P-type transistor when the chip enters the burn-in test. The specific structure of the protection circuit provided in the disclosure will be described in detail below through specific embodiments.

Figure 1:
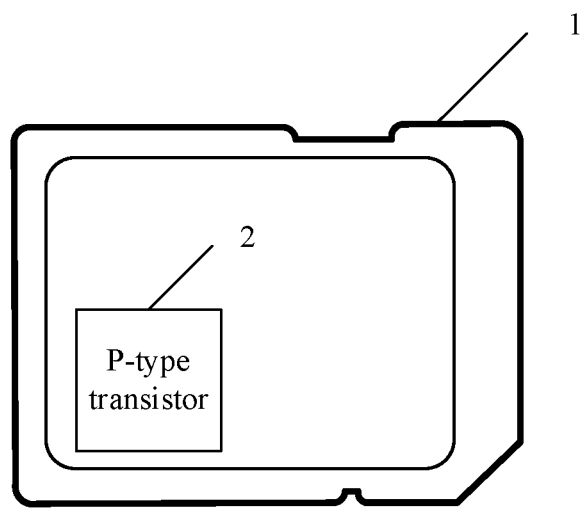
FIG. 1 is a schematic diagram of an application scenario of a protection circuit provided in an embodiment of the disclosure.

The protection circuit provided in the embodiments of the disclosure can be applied to a chip or an integrated circuit. It can be understood that the chip is a miniaturized integrated circuit. The protection circuit provided in the embodiments of the disclosure can also be applied to a non-miniaturized integrated circuit. The protection circuit provided in the embodiments of the disclosure can be applied to a chip or an integrated circuit or a memory including at least one P-type transistor. FIG. 1 is a schematic diagram of an application scenario of a protection circuit provided in an embodiment of the disclosure. As shown in FIG. 1, the application scenario of the protection circuit provided in the embodiment of the disclosure involves a chip 1 and a P-type transistor 2. The chip 1 includes at least one P-type transistor. The protection circuit provided in the embodiment of the disclosure can be applied in the chip 1, can protect the at least one P-type transistor included in the chip 1, and can avoid damage caused by the NBTI effect to the at least one P-type transistor when the chip 1 enters a burn-in test. When the chip enters the burn-in test, the protection circuit controls an input level signal to a part of the circuit including the P-type transistor to be a high-level signal. When the chip exits the burn-in test, the input level signal to the part of the circuit including the P-type transistor is not changed (i.e., a normal working state of the part of the circuit including the P-type transistor is not changed), thereby avoiding damage caused by the NBTI effect to the P-type transistor part in the chip 1. It should be noted that the application scenario shown in FIG. 1 is only an example, and does not constitute a limitation on the application scenario of the protection circuit in the disclosure.

Figure 2:
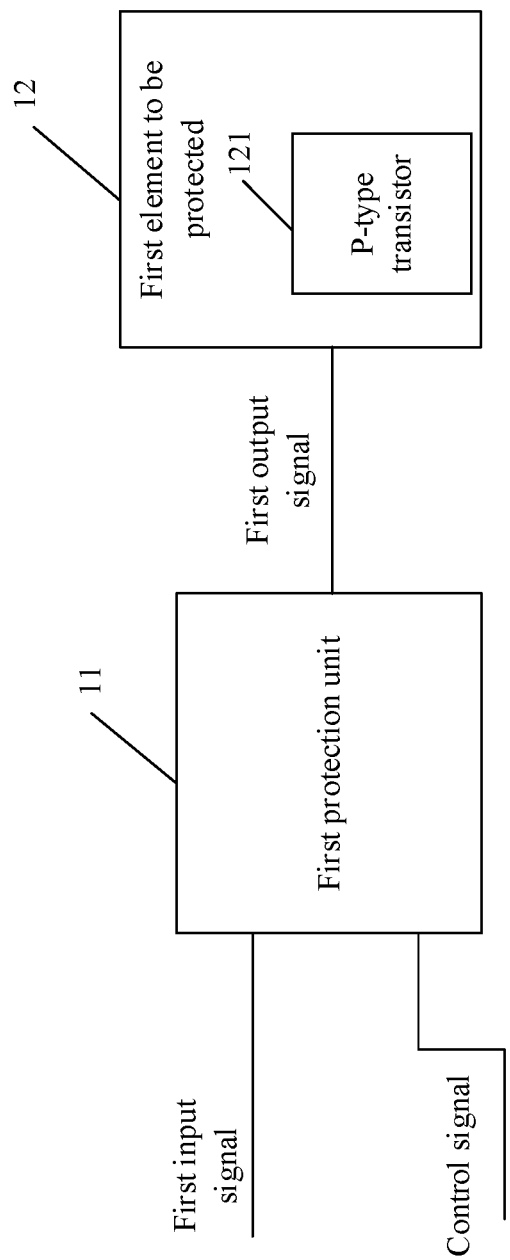
FIG. 2 is a schematic structural diagram of a protection circuit provided in an embodiment of the disclosure.

FIG. 2 is a schematic structural diagram of a protection circuit provided in an embodiment of the disclosure. The protection circuit in this embodiment can be applied in a chip. As shown in FIG. 2, the protection circuit in this embodiment can include a first protection unit 11 and a first element 12 to be protected. The first protection unit 11 is configured to receive a first input signal and a control signal, and is configured to output a first output signal.

The first element 12 to be protected includes a first P-type transistor 121, and a gate of the first P-type transistor 121 is configured to receive the first output signal. The P-type transistor can be a PMOS tube.

When the chip enters a burn-in test, the first output signal is a high-level signal.

Exemplarily, because NBTI effect will occur when an input signal to the gate of the P-type transistor is a low-level signal (that is, a negative gate voltage is applied), when the input signal (i.e., the first output signal) to the gate of the first P-type transistor is a high-level signal when the chip enters the burn-in test, NBTI effect of the first P-type transistor can be avoided, thereby avoiding damage caused by the NBTI effect to the first P-type transistor when the chip enters the burn-in test.

Exemplarily, the first output signal is controlled by the first input signal and the control signal to be a high-level signal when the chip enters the burn-in test. In an implementation, when the first input signal is a high-level signal, the first output signal is a high-level signal when the control signal is a first level signal, and the first output signal is a low-level signal when the control signal is a second level signal. The first level signal can be a high-level signal or a low-level signal, and correspondingly, the second level signal can be a low-level signal or a high-level signal.

In an implementation, when the chip enters the burn-in test, the control signal is the first level signal, when the chip enters other tests, the control signal is the second level signal, and the other tests are test states that do not include the burn-in test, for example, test states of other reliability tests.

As an implementation, depending on the circuit of the chip itself, the first protection unit can include any one of a NAND gate circuit, a NOR gate circuit, an AND-OR-NOT gate circuit, an AND gate circuit, an OR gate circuit, an XOR gate circuit, an XNOR gate circuit, a transmission gate, a flip-flop, a latch, or a register.

The protection circuit provided in this embodiment can be applied in a chip. A first protection unit and a first element to be protected are provided. The first protection unit is configured to receive a first input signal and a control signal and is configured to output a first output signal. The first element to be protected includes a first P-type transistor and a gate of the first P-type transistor is configured to receive the first output signal. When the chip enters a burn-in test, the first output signal is a high-level signal. NBTI effect will occur when an input signal to the gate of the P-type transistor is a low-level signal. Therefore, when the chip enters the burn-in test, the input signal (i.e., the first output signal) to the gate of the first P-type transistor is a high-level signal, such that NBTI effect of the first P-type transistor can be avoided, thereby avoiding damage caused by the NBTI effect to the first P-type transistor when the chip enters the burn-in test, and improving the reliability of the chip.

Figure 3:
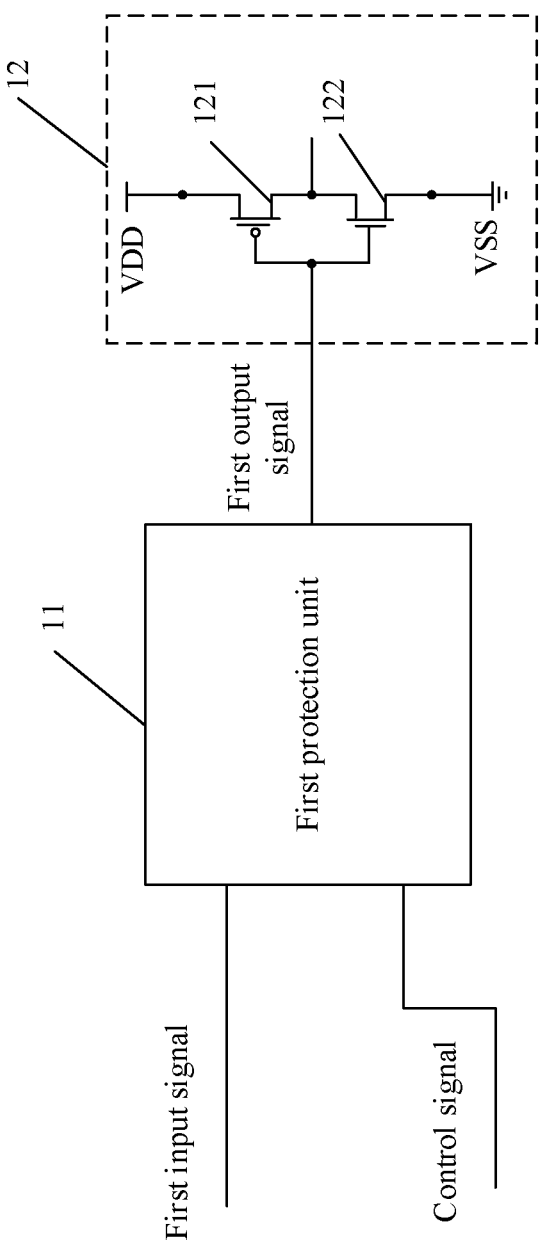
FIG. 3 is a schematic structural diagram of a protection circuit provided in an embodiment of the disclosure.

In an implementation, the first element to be protected can be an inverter consisting of a P-type transistor and an N-type transistor, and the first element to be protected can further include a first N-type transistor. FIG. 3 is a schematic structural diagram of a protection circuit provided in an embodiment of the disclosure. The protection circuit in this embodiment can be applied in a chip. As shown in FIG. 3, the protection circuit in this embodiment can include a first protection unit 11 and a first element 12 to be protected. The first protection unit 11 is configured to receive a first input signal and a control signal, and is configured to output a first output signal.

The first element 12 to be protected includes a first P-type transistor 121 and a first N-type transistor 122, and a gate of the first P-type transistor 121 is configured to receive the first output signal. When the chip enters a burn-in test, the first output signal is a high-level signal.

As shown in FIG. 3, the gate of the first P-type transistor 121 is connected to a gate of the first N-type transistor 122, a source of the first P-type transistor 121 is connected to a power supply terminal VDD, a drain of the first P-type transistor 121 is connected to a drain of the first N-type transistor 122, and a source of the first N-type transistor 122 is connected to a ground terminal VSS.

In this embodiment, the gate of the first P-type transistor 121 is configured to receive the first output signal, and when the chip enters the burn-in test, the first output signal is a high-level signal. NBTI effect will occur when an input signal to the gate of the P-type transistor is a low-level signal. When the input signal (i.e., the first output signal) to the gate of the first P-type transistor is a high-level signal when the chip enters the burn-in test, NBTI effect of the first P-type transistor can be avoided, thereby avoiding damage caused by the NBTI effect to the first P-type transistor when the chip enters the burn-in test.

The protection circuit shown in FIG. 2 and FIG. 3 includes a first protection unit and a first element to be protected, and can be called one-stage protection circuit. Further, a multi-stage protection circuit can be provided according to the number of P-type transistors that need to be included in a chip, and each stage of protection circuit can include one protection unit and at least one element to be protected. The structure of a multi-stage protection circuit will be described below by using a two-stage protection circuit as an example.

Figure 4:
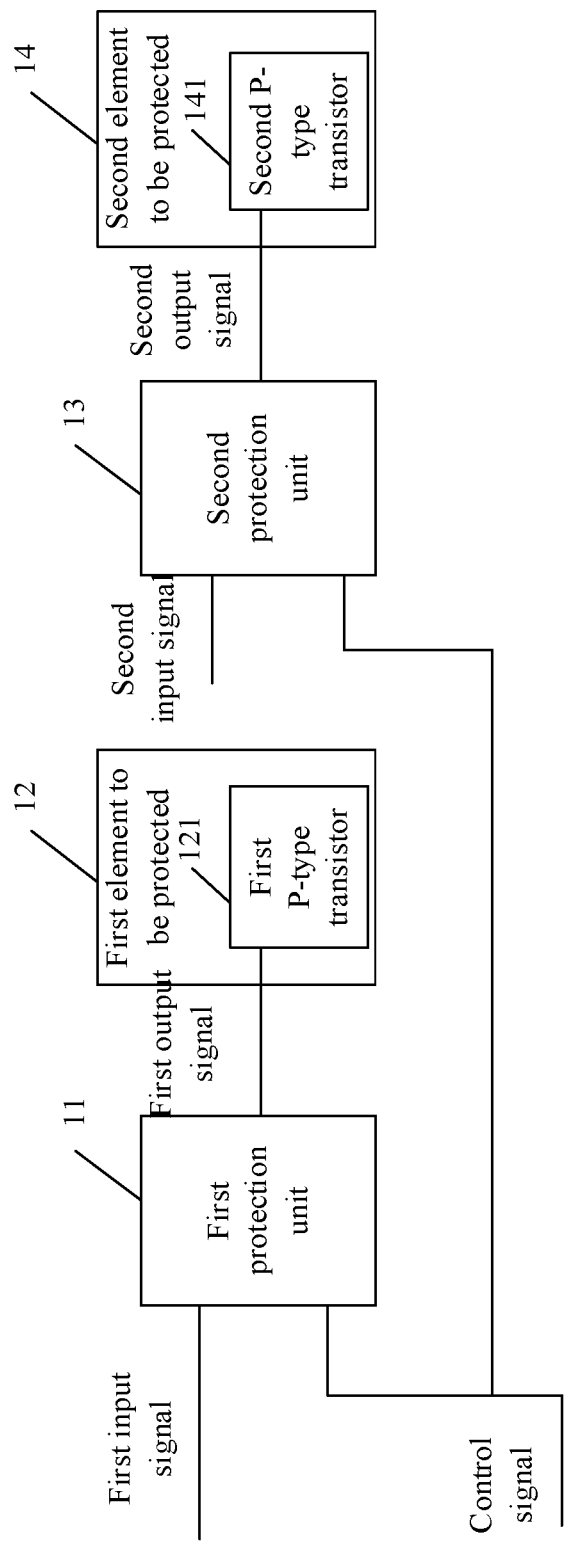
FIG. 4 is a schematic structural diagram of a protection circuit provided in an embodiment of the disclosure.

FIG. 4 is a schematic structural diagram of a protection circuit provided in an embodiment of the disclosure. The protection circuit in this embodiment can be applied in a chip. As shown in FIG. 4, based on the circuit shown in FIG. 2 or FIG. 3, the protection circuit in this embodiment can further include a second protection unit 13 and a second element 14 to be protected. The second protection unit 13 is configured to receive a second input signal and a control signal, and is configured to output a second output signal. The second element 14 to be protected includes a second P-type transistor 141, and a gate of the second P-type transistor 141 is configured to receive the second output signal.

When the chip enters a burn-in test, the second output signal is a high-level signal.

Exemplarily, NBTI effect will occur when an input signal to the gate of the P-type transistor is a low-level signal (that is, a negative gate voltage is applied). When the input signal (i.e., the first output signal) to the gate of the first P-type transistor is a high-level signal and the input signal (i.e., the second output signal) to the gate of the second P-type transistor is a high-level signal when the chip enters the burn-in test, NBTI effect of the first P-type transistor and the second P-type transistor can be avoided, thereby avoiding damage caused by the NBTI effect to the first P-type transistor and the second P-type transistor when the chip enters the burn-in test.

In this embodiment, based on the circuit shown in FIG. 4, exemplarily, the second output signal is controlled by the second input signal and the control signal to be a high-level signal when the chip enters the burn-in test. In an implementation, when the second input signal is a high-level signal, the second output signal is a high-level signal when the control signal is a first level signal, and the second output signal is a low-level signal when the control signal is a second level signal. The first level signal can be a high-level signal or a low-level signal, and correspondingly, the second level signal can be a low-level signal or a high-level signal.

In an implementation, when the chip enters the burn-in test, the control signal is the first level signal, when the chip enters other tests, the control signal is the second level signal, and the other tests are test states that do not include the burn-in test.

As an implementation, depending on the circuit of the chip itself, the second protection unit can include any one of a NAND gate circuit, a NOR gate circuit, an AND-OR-NOT gate circuit, an AND gate circuit, an OR gate circuit, an XOR gate circuit, an XNOR gate circuit, a transmission gate, a flip-flop, a latch, or a register.

The protection circuit provided in this embodiment can be applied in a chip. A first protection unit, a first element to be protected, a second protection unit, and a second element to be protected are provided. The first protection unit is configured to receive a first input signal and a control signal, and is configured to output a first output signal. The first element to be protected includes a first P-type transistor, and a gate of the first P-type transistor is configured to receive the first output signal. The second protection unit is configured to receive a second input signal and a control signal, and is configured to output a second output signal. The second element to be protected includes a second P-type transistor, and a gate of the second P-type transistor is configured to receive the second output signal. When the chip enters a burn-in test, the first output signal and the second output signal are both high-level signals. NBTI effect will occur when an input signal to the gate of the P-type transistor is a low-level signal. When the input signal (i.e., the first output signal) to the gate of the first P-type transistor is a high-level signal and the input signal (i.e., the second output signal) to the gate of the second P-type transistor is a high-level signal when the chip enters the burn-in test, NBTI effect of the first P-type transistor and the second P-type transistor can be avoided, thereby avoiding damage caused by the NBTI effect to the first P-type transistor and the second P-type transistor when the chip enters the burn-in test.

Figure 5:
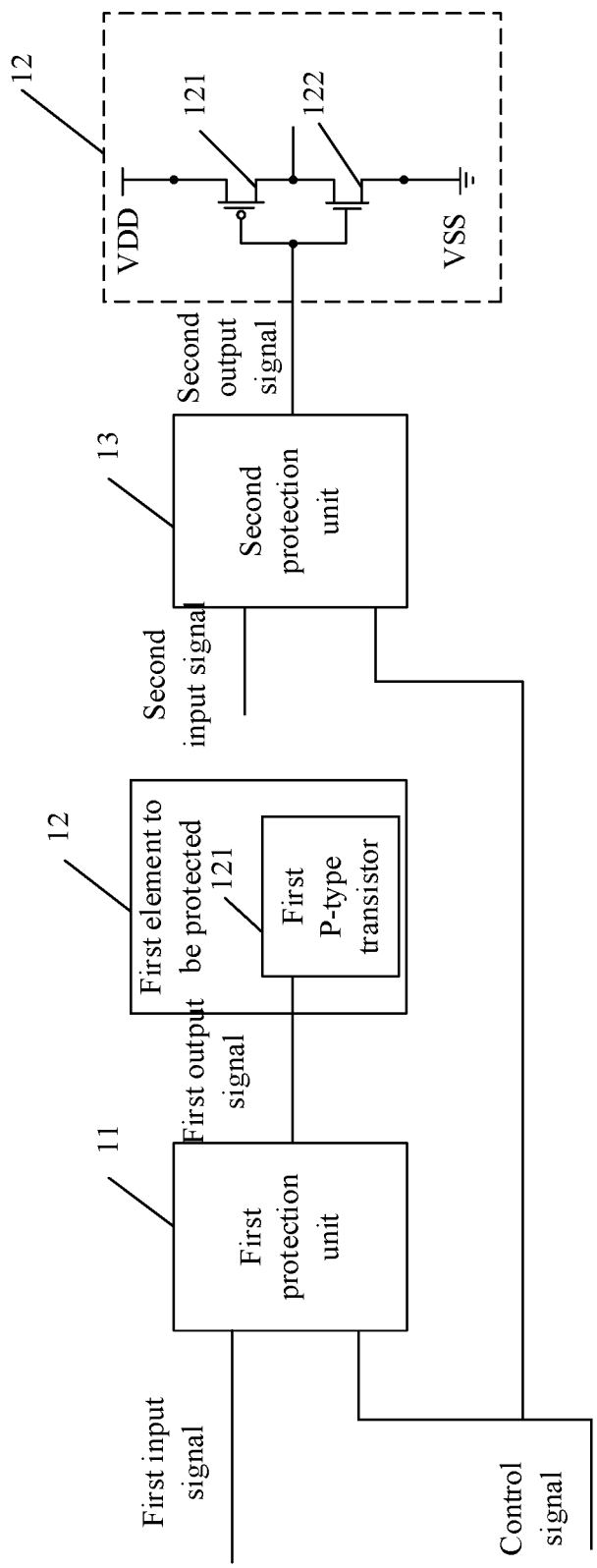
FIG. 5 is a schematic structural diagram of a protection circuit provided in an embodiment of the disclosure.

In an implementation, the second element to be protected can be an inverter consisting of a P-type transistor and an N-type transistor, and the second element to be protected can further include a second N-type transistor. FIG. 5 is a schematic structural diagram of a protection circuit provided in an embodiment of the disclosure. The protection circuit in this embodiment can be applied in a chip. As shown in FIG. 5, in the protection circuit in this embodiment, the second element 14 to be protected includes a second P-type transistor 141 and a second N-type transistor 142.

A gate of the second P-type transistor 141 is connected to a gate of the second N-type transistor 142, a source of the second P-type transistor 141 is connected to a power supply terminal VDD, a drain of the second P-type transistor 141 is connected to a drain of the second N-type transistor 142, and a source of the second N-type transistor 142 is connected to a ground terminal VSS.

In this embodiment, the gate of the second P-type transistor 141 is configured to receive the second output signal, and when the chip enters the burn-in test, the second output signal is a high-level signal. NBTI effect will occur when an input signal to the gate of the P-type transistor is a low-level signal. Therefore, when the input signal (i.e., the second output signal) to the gate of the second P-type transistor 141 is a high-level signal when the chip enters the burn-in test, NBTI effect of the second P-type transistor can be avoided, thereby avoiding damage caused by the NBTI effect to the second P-type transistor when the chip enters the burn-in test.

The structure of the protection circuit in the disclosure will be described below in combination with specific embodiments. The specific structure of the protection circuit in the disclosure is not limited to any of the following structures.

Figure 6:
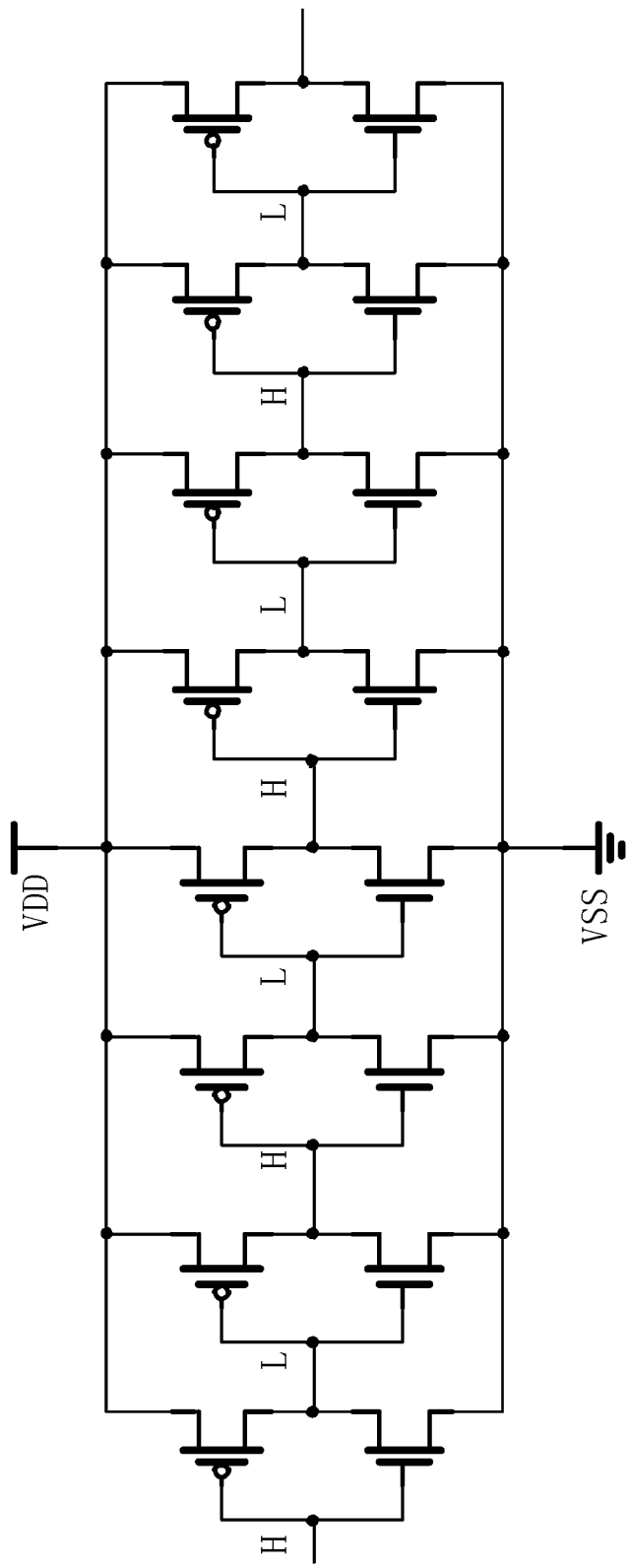
FIG. 6 is a schematic diagram of an 8-stage inverter chain.
Figure 7:
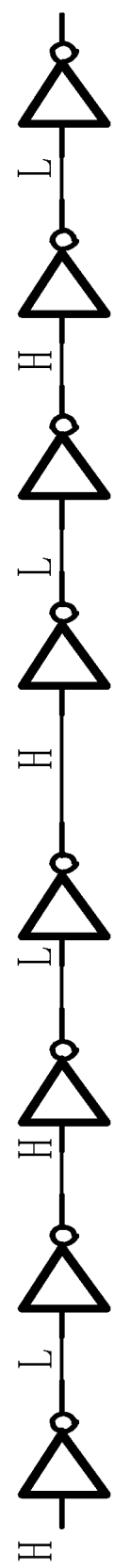
FIG. 7 is a simplified diagram of the inverter chain corresponding to FIG. 6.

Exemplarily, in design of a Dynamic Random-Access Memory (DRAM), transmission of a signal transmission chain can be simplified to a common inverter chain. Therefore, the input level of each stage of inverter is the inverse of the input level of the previous stage of inverter. Taking a first-stage input level signal being a high-level signal as an example, input level signals of P-type transistors of inverters in all even-numbered stages are low-level signals. Therefore, for the P-type transistors of the inverters in all even-numbered stages, varying degrees of damage will be caused by NBTI effect to original clock signals after a burn-in test, causing the clock duty cycle to change. An eight-stage inverter chain is taken as an example. FIG. 6 is a schematic diagram of an eight-stage inverter chain, and FIG. 7 is a simplified diagram of the inverter chain corresponding to FIG. 6. In the inverter chain shown in FIG. 6 and FIG. 7, a first-stage input level signal is a high-level signal (referred to as H), the input level of each stage of inverter is the inverse of the input level of the previous stage of inverter, and input level signals of P-type transistors of inverters in all even-numbered stages are all low-level signals (referred to as L). Therefore, during a burn-in test of the DRAM, the P-type transistors of the inverters in the even-numbered stages will be damaged due to NBTI effect during the test. In order to avoid damage caused by NBTI effect to the P-type transistors of the inverters in the even-numbered stages during the test, a one-stage or multi-stage protection circuit can be added to a transmission circuit of the DRAM. An output level signal of a part of the circuit in the burn-in test is changed by a control signal, an input level signal of each stage remains unchanged in a normal working state, and a transmission level signal of the part of the circuit is inverted to a high level only when entering the burn-in test, thereby avoiding damage to the P-type transistors of some inverters.

Figure 8:
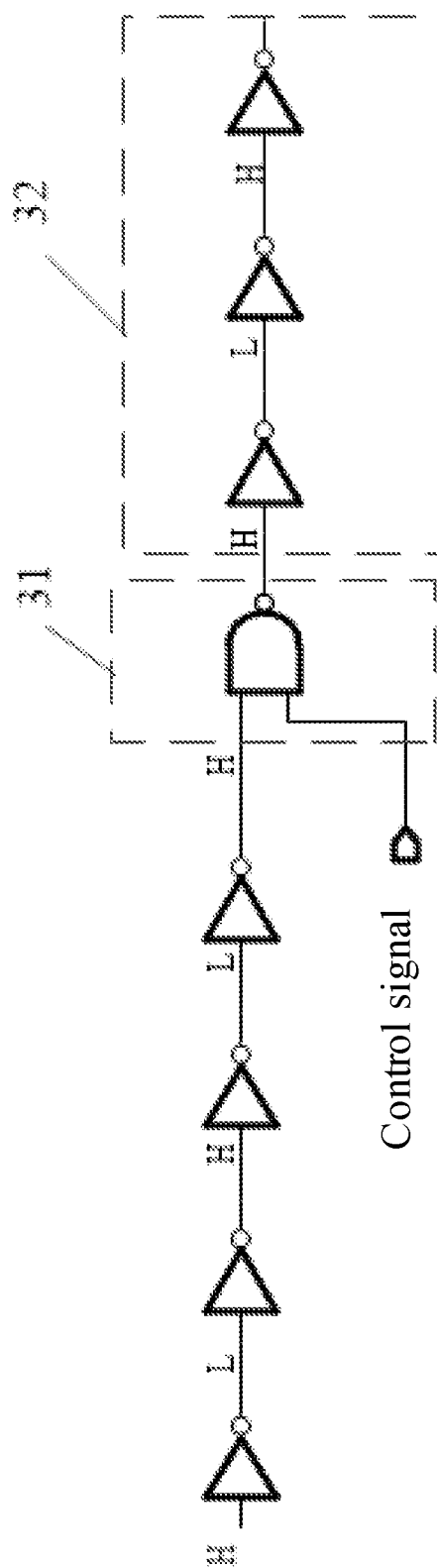
FIG. 8 is a schematic diagram after adding a one-stage protection circuit to the inverter chain shown in FIG. 7.

FIG. 8 is a schematic diagram after adding a one-stage protection circuit to the inverter chain shown in FIG. 7. The protection circuit shown in FIG. 8 includes a protection unit 31 and an element 32 to be protected. The protection unit 31 is specifically a NAND gate circuit, and the protection unit 31 is configured to receive an input signal and a control signal. In the inverter chain shown in FIG. 7, the input signal received by the protection unit 31 is a high-level signal. During a burn-in test, a high-level signal is output after the control signal and the high-level signal pass through the protection unit 31, input signals of the sixth-stage inverter and the eighth-stage inverter are both changed to high-level signals, thereby avoiding damage to the P-type transistors of the sixth-stage inverter and the eighth-stage inverter, and the input signal of the seventh-stage inverter is changed into a low-level signal. Here, it should be noted that since the input signal of the seventh-stage inverter in a normal working state is a high-level signal, and the input signal of the seventh-stage inverter is a low-level signal during the burn-in test, damage due to NBTI effect will be caused only in the burn-in test, but no damage due to NBTI effect will be caused in the normal working state. It can be understood that, in the protection circuit shown in FIG. 8, the element 32 to be protected includes the sixth-stage inverter, the seventh-stage inverter, and the eighth-stage inverter, specifically, P-type and N-type transistors of the sixth-stage inverter, and P-type and N-type transistors of the eighth-stage inverter. In the normal working state, the protection unit 31 is an inverter.

The input signal received by the protection unit 31 is a non-clock signal, and the transmission level signal is fixed as a high-level signal or a low-level signal in a normal state.

Figure 9:
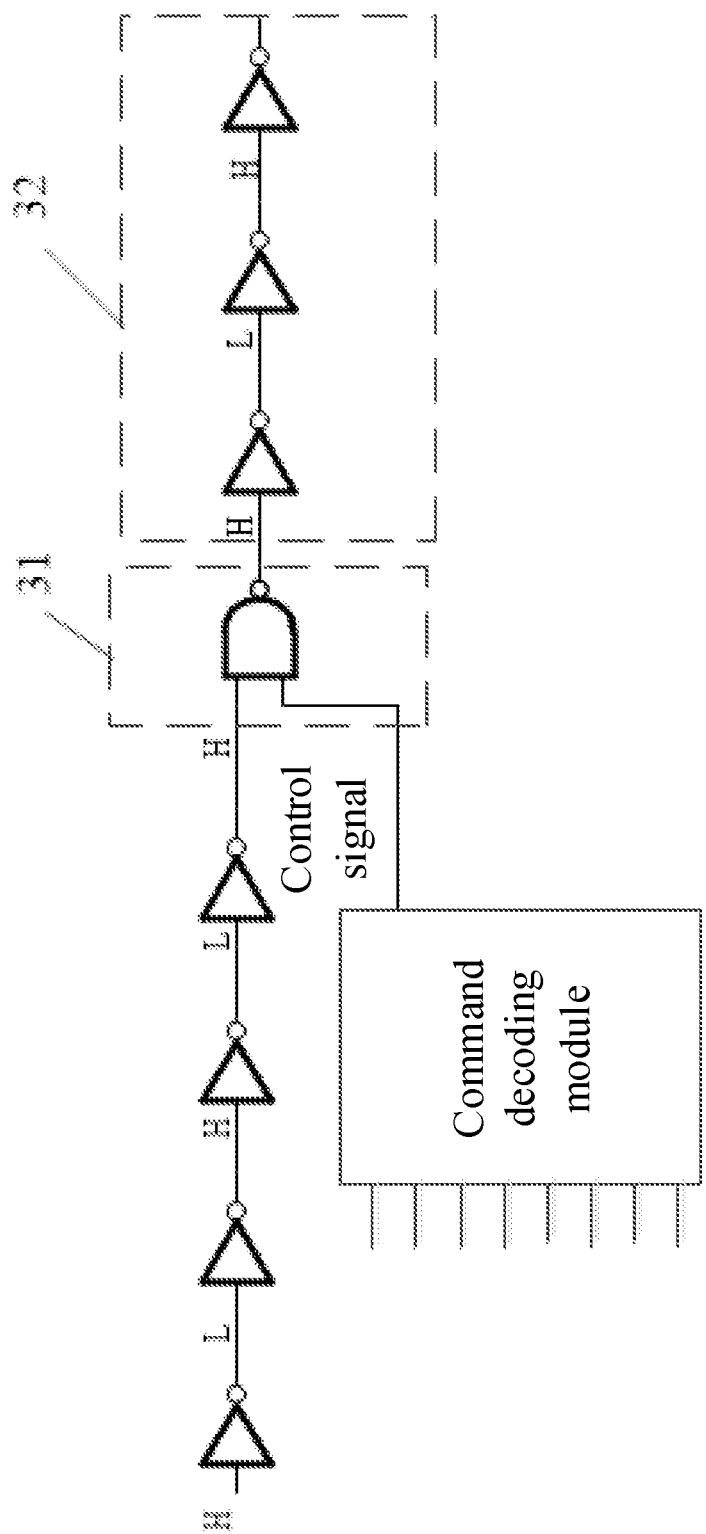
FIG. 9 is a schematic diagram of input of a control signal in the protection circuit shown in FIG. 8.

FIG. 9 is a schematic diagram of input of a control signal in the protection circuit shown in FIG. 8. As shown in FIG. 9, the control signal is a signal output by a command decoding module, the command decoding module is a module (such as a command decoder) in a DRAM, and the command decoding module has multiple pins. For example, a code combination of the command decoding module sequentially enters the protection circuit according to a pre-designed command sequence. The command decoding module is configured to output a control signal which is a first level signal when receiving a start command for a burn-in test, and is configured to output a control signal which is a second level signal when receiving an end command for the burn-in test. For example, in this embodiment, the first level signal is a low-level signal, and the second level signal is a high-level signal.

Figure 10:
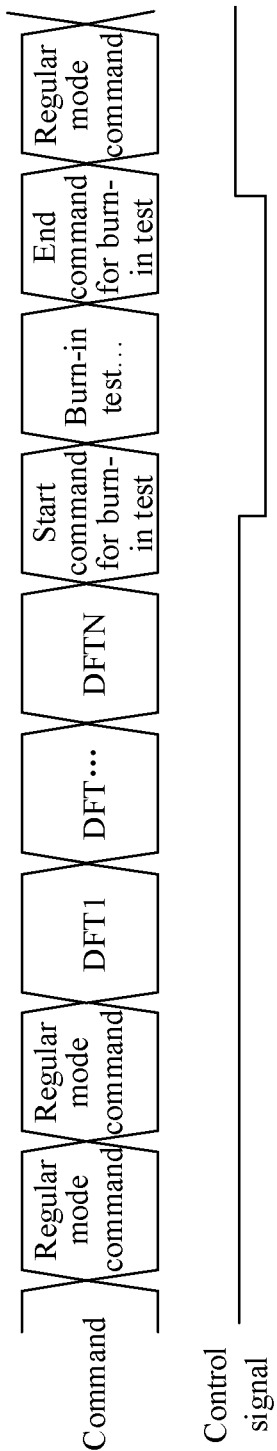
FIG. 10 is a schematic diagram of a command received by a command decoding module and a control signal output corresponding to the received command.

FIG. 10 is a schematic diagram of a command received by a command decoding module and a control signal output corresponding to the received command. As shown in FIG. 10, a regular mode command is a command that appears in a regular mode of a DRAM, such as an activation command or a self-refresh command. DFTN is a Design for test mode command, and a burn-in test command is a type of test command in DFTN. Exemplarily, as shown in FIG. 10, when the command decoding module is configured to receive a regular mode command and DFTN, control signals output are high-level signals. When the command decoding module is configured to receive a start command for a burn-in test, a control signal output is a low-level signal. A control signal output is a high-level signal when the command decoding module is configured to receive an end command for the burn-in test.

Figure 11:
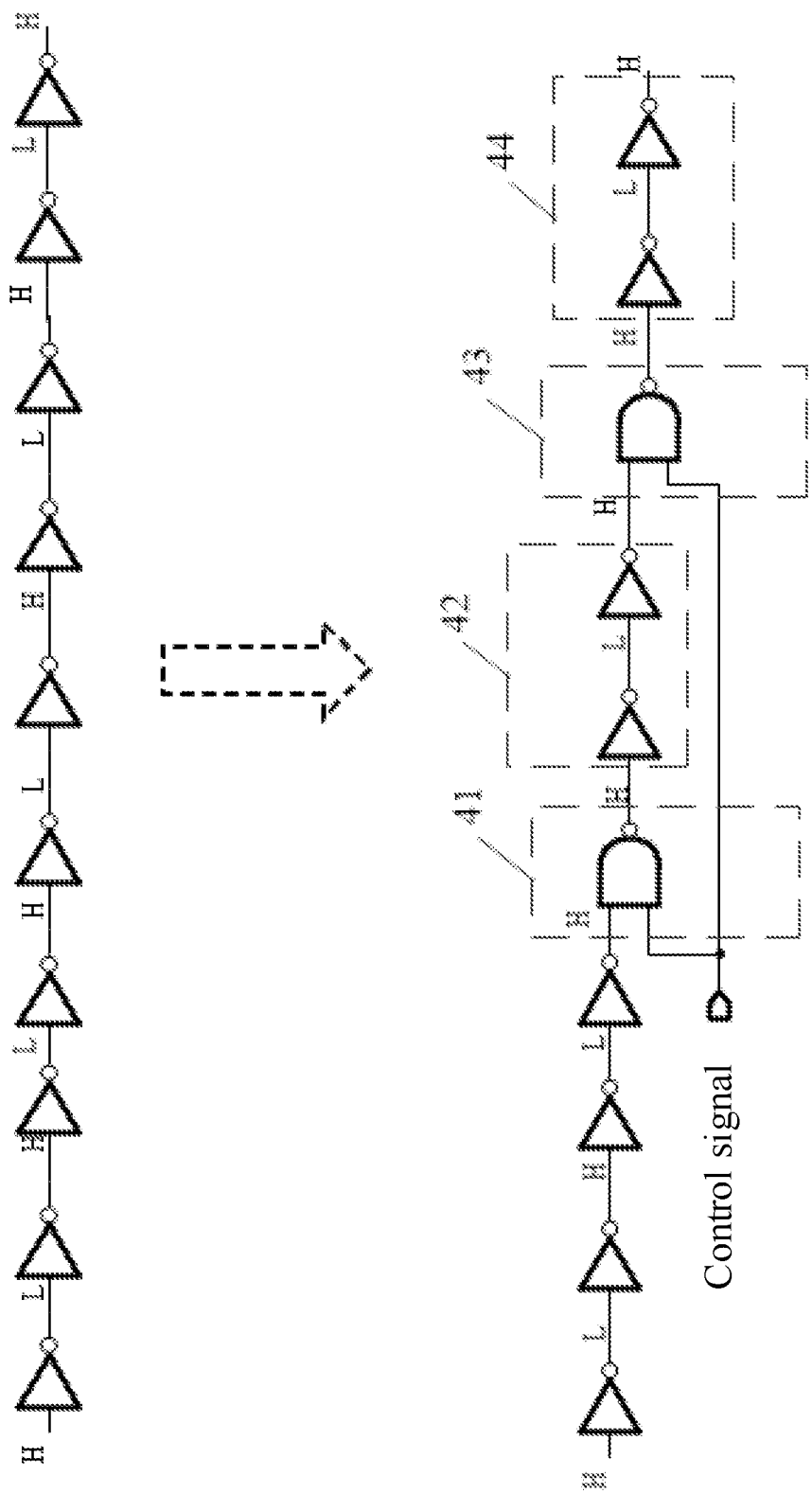
FIG. 11 is a schematic diagram after adding a two-stage protection circuit to a ten-stage inverter chain provided in an embodiment of the disclosure.

FIG. 8 shows a one-stage protection circuit. An example of a two-stage protection circuit is shown below in combination with FIG. 11. FIG. 11 is a schematic diagram after adding a two-stage protection circuit to a ten-stage inverter chain provided in an embodiment of the disclosure. The part above the arrow in FIG. 11 is a schematic diagram of a ten-stage inverter chain, and the part below the arrow in FIG. 11 is a schematic diagram after adding a two-stage protection circuit. The protection circuit shown in FIG. 11 includes a first protection unit 41, a first element 42 to be protected, a second protection unit 43, and a second element 44 to be protected. The first protection unit 41 is specifically a NAND gate circuit, and the first element 42 to be protected includes a sixth-stage inverter and a seventh-stage inverter. An input signal received by the first protection unit 41 is a high-level signal. During a burn-in test, after a control signal and the high-level signal received by the first protection unit 41 pass through the first protection unit 41, a high-level signal is output, and thus, an input signal of the sixth-stage inverter is a high-level signal, and an input signal of the seventh-stage inverter is a low-level signal. A P-type transistor of the sixth-stage inverter can be prevented from being damaged due to NBTI effect.

The second protection unit 43 is specifically a NAND gate circuit, and the second element 44 to be protected includes a ninth-stage inverter and a tenth-stage inverter. An input signal received by the second protection unit 43 is a high-level signal. During a burn-in test, after a control signal and the high-level signal received by the second protection unit 43 pass through the second protection unit 43, a high-level signal is output, and thus, an input signal of the ninth-stage inverter is a high-level signal, and an input signal of the tenth-stage inverter is a low-level signal. A P-type transistor of the ninth-stage inverter can be prevented from being damaged due to NBTI effect. In a normal working state, the first protection unit 41 and the second protection unit 43 are inverters.

It should be noted that in a practical application, the number of stages of the protection circuit can be designed according to requirements for an internal circuit of a memory, and the disclosure is not limited to a one-stage protection circuit and a two-stage protection circuit.

Figure 12:
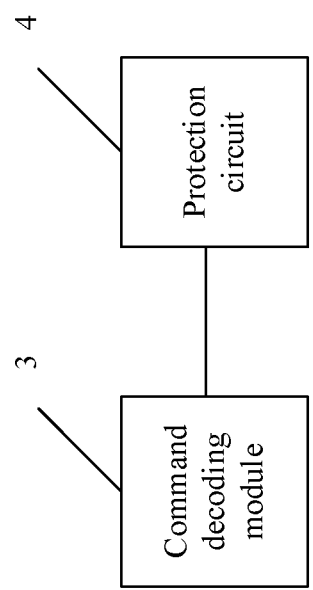
FIG. 12 is a schematic structural diagram of a memory provided in an embodiment of the disclosure.

The embodiment of the disclosure also provides a memory. FIG. 12 is a schematic structural diagram of a memory provided in an embodiment of the disclosure. As shown in FIG. 12, the memory in this embodiment includes a command decoding module 3 and a protection circuit 4. The command decoding module 3 is configured to output a control signal, and the protection circuit 4 is any of the protection circuits in the foregoing embodiments.

In an implementation, the command decoding module 3 is configured to output the control signal which is the first level signal when receiving a start command for the burn-in test, and output the control signal which is the second level signal when receiving an end command for the burn-in test.

In an implementation, the first input signal is a first level signal at a fixed level when the memory is in a working state. For example, the first level signal can be a low-level signal or a high-level signal.

In an implementation, the first input signal is a second level signal at a fixed level when the memory is in the working state. For example, the second level signal can be a high-level signal or a low-level signal.

In an implementation, the first input signal is a non-clock signal when the memory is in the working state.

Finally, it should be noted that: the foregoing embodiments are merely intended for describing the technical solutions of the disclosure other than limiting the disclosure. Although the disclosure is described in detail with reference to the foregoing embodiments, those skilled in the art should understand that they may still make modifications to the technical solutions described in the foregoing embodiments or make equivalent replacements to some or all technical features thereof, and such modifications or replacements do not make the essence of the corresponding technical solutions depart from the scope of the technical solutions of the embodiments of the disclosure.

What is claimed is:

1. A protection circuit applied in a chip, comprising:
a first protection unit, wherein the first protection unit is configured to receive a first input signal and a control signal, and is configured to output a first output signal; and
a first element to be protected comprising a first P-type transistor, wherein a gate of the first P-type transistor is configured to receive the first output signal;
wherein when the chip enters a burn-in test, the first output signal is a high-level signal,
wherein the protection circuit further comprises: a second protection unit and a second element to be protected,
wherein the second protection unit is configured to receive a second input signal and the control signal, and is configured to output a second output signal;
the second element to be protected comprises a second P-type transistor, and a gate of the second P-type transistor is configured to receive the second output signal; and
when the chip enters the burn-in test, the second output signal is a high-level signal.

2. The protection circuit of claim 1, wherein
when the first input signal is a high-level signal, the first output signal is a high-level signal when the control signal is a first level signal, and the first output signal is a low-level signal when the control signal is a second level signal.

3. The protection circuit of claim 2, wherein when the chip enters the burn-in test, the control signal is the first level signal; when the chip enters other tests, the control signal is the second level signal, and the other tests are test states that do not comprise the burn-in test.

4. The protection circuit of claim 1, wherein the first protection unit comprises any one of a NAND gate circuit, a NOR gate circuit, an AND-OR-NOT gate circuit, an AND gate circuit, an OR gate circuit, an XOR gate circuit, an XNOR gate circuit, a transmission gate, a flip-flop, a latch, or a register.

5. The protection circuit of claim 1, wherein the first element to be protected further comprises a first N-type transistor.

6. The protection circuit of claim 5, wherein the gate of the first P-type transistor is connected to a gate of the first N-type transistor, a source of the first P-type transistor is connected to a power supply terminal, a drain of the first P-type transistor is connected to a drain of the first N-type transistor, and a source of the first N-type transistor is connected to a ground terminal.

7. The protection circuit of claim 1, wherein
when the second input signal is a high-level signal, the second output signal is a high-level signal when the control signal is a first level signal, and the second output signal is a low-level signal when the control signal is a second level signal.

8. The protection circuit of claim 1, wherein the second element to be protected further comprises a second N-type transistor.

9. The protection circuit of claim 8, wherein the gate of the second P-type transistor is connected to a gate of the second N-type transistor, a source of the second P-type transistor is connected to a power supply terminal, a drain of the second P-type transistor is connected to a drain of the second N-type transistor, and a source of the second N-type transistor is connected to a ground terminal.

10. A memory, comprising a command decoding module and a protection circuit, wherein the protection circuit comprises:
a first protection unit, wherein the first protection unit is configured to receive a first input signal and a control signal, and is configured to output a first output signal; and
a first element to be protected comprising a first P-type transistor, wherein a gate of the first P-type transistor is configured to receive the first output signal,
wherein when the chip enters a burn-in test, the first output signal is a high-level signal, and the command decoding module is configured to output the control signal,
wherein the command decoding module is configured to output the control signal which is the first level signal when receiving a start command for the burn-in test, and output the control signal which is the second level signal when receiving an end command for the burn-in test.

11. The memory of claim 10, wherein when the first input signal is a high-level signal, the first output signal is a high-level signal when the control signal is a first level signal, and the first output signal is a low-level signal when the control signal is a second level signal.

12. The memory of claim 11, wherein when the chip enters the burn-in test, the control signal is the first level signal; when the chip enters other tests, the control signal is the second level signal, and the other tests are test states that do not comprise the burn-in test.

13. The memory of claim 10, wherein the first protection unit comprises any one of a NAND gate circuit, a NOR gate circuit, an AND-OR-NOT gate circuit, an AND gate circuit, an OR gate circuit, an XOR gate circuit, an XNOR gate circuit, a transmission gate, a flip-flop, a latch, or a register.

14. The memory of claim 10, wherein the first element to be protected further comprises a first N-type transistor.

15. The memory of claim 14, wherein the gate of the first P-type transistor is connected to a gate of the first N-type transistor, a source of the first P-type transistor is connected to a power supply terminal, a drain of the first P-type transistor is connected to a drain of the first N-type transistor, and a source of the first N-type transistor is connected to a ground terminal.

16. The memory of claim 10, wherein the first input signal is a first level signal at a fixed level when the memory is in a working state.

17. The memory of claim 10, wherein the first input signal is a second level signal at a fixed level when the memory is in a working state.

18. The memory of claim 10, wherein the first input signal is a non-clock signal when the memory is in a working state.

19. A memory, comprising a command decoding module and a protection circuit, wherein the protection circuit comprises:
- a first protection unit, wherein the first protection unit is configured to receive a first input signal and a control signal, and is configured to output a first output signal; and
- a first element to be protected comprising a first P-type transistor, wherein a gate of the first P-type transistor is configured to receive the first output signal,
- wherein when the chip enters a burn-in test, the first output signal is a high-level signal, and the command decoding module is configured to output the control signal,
- wherein the protection circuit further comprises: a second protection unit and a second element to be protected,
- wherein the second protection unit is configured to receive a second input signal and the control signal, and is configured to output a second output signal;
- the second element to be protected comprises a second P-type transistor, and a gate of the second P-type transistor is configured to receive the second output signal; and
- when the chip enters the burn-in test, the second output signal is a high-level signal.

* * * * *